United States Patent [19]
Burbank et al.

[11] 4,386,318
[45] May 31, 1983

[54] METHOD AND APPARATUS TO COMPENSATE A GRADIOMETER HAVING FIRST AND SECOND UNWANTED TERMS

[75] Inventors: Max B. Burbank, Maple Ridge; Randy K. Lomnes; Jiri Vrba, both of Port Coquitlam; Alistair A. Fife, Coquitlam, all of Canada

[73] Assignee: Her Majesty the Queen in right of Canada, as represented by the Minister of National Defence, Ottawa, Canada

[21] Appl. No.: 191,819

[22] Filed: Sep. 26, 1980

[51] Int. Cl.$^3$ .................. G01R 33/02; G01N 27/72
[52] U.S. Cl. ................................ 324/244; 324/245; 324/225
[58] Field of Search ............... 324/225, 244, 245, 246, 324/247, 248, 249

[56] References Cited

U.S. PATENT DOCUMENTS 3,488,579 1/1970 Schonstedt ..................... 324/245
3,530,375 9/1970 Passier ........................... 324/244

OTHER PUBLICATIONS

Zimmerman, "SQID Instruments ...", Feb. 1977, Jor. of Applied Physics, vol. 48, No. 2, pp. 702–710.

Primary Examiner—Gerard R. Strecker
Assistant Examiner—Walter E. Snow
Attorney, Agent, or Firm—Cushman, Darby & Cushman

[57] ABSTRACT

A device and method producing a compensated gradiometer signal from an uncompensated gradiometer signal having at least one unwanted term which varies as a function of magnetic field. The device is comprised of a sensing unit for sensing the magnetic field. A generator is provided for producing a first vector signal which is representative of the magnetic field. A function generator is provided for producing a second vector signal which represents a component of one of the at least one unwanted term. A mixer is connected to the generator and the function generator for producing a vector output signal which is equal to the one of the at least one unwanted term. Finally, a subtractor unit is provided which is connected to the mixing means for subtracting the output vector signal from the uncompensated gradiometer signal to thereby produce the compensated gradiometer signal.

2 Claims, 1 Drawing Figure

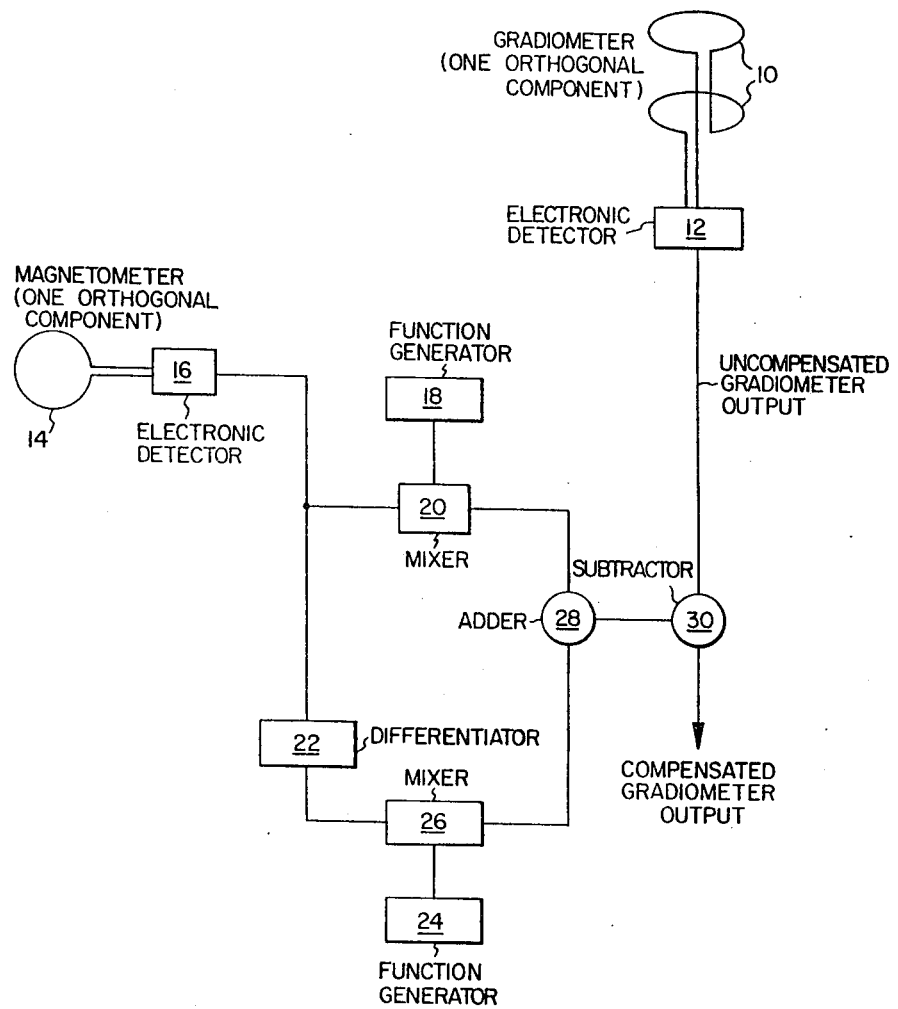

METHOD AND APPARATUS TO COMPENSATE A GRADIOMETER HAVING FIRST AND SECOND UNWANTED TERMS

INTRODUCTION AND GENERAL DISCUSSION

The present invention relates to gradiometers which measure the gradient of a magnetic field and more particularly to an apparatus for enhancing the resolution of a gradiometer by removing from the gradiometer signal, unwanted portions which are caused by imperfections in the manufacture of the gradiometer and by its close environment.

A gradiometer is a three-dimensional device and measures the change in magnetic field along a vector in space. The device does this by measuring the gradient along three orthogonal components of the vector.

A gradiometer signal may be defined as follows:

$$\bar{S} = \bar{C}\cdot\bar{B} + \bar{E}\cdot\dot{\bar{B}} + \bar{a}\cdot\bar{y} + K \qquad (1)$$

where $\bar{C}\cdot\bar{B}$ equals the common mode signal which is due to imperfections in the construction of the gradiometer and due to fixed objects which induce magnetization. The value of $\bar{C}\cdot\bar{B}$ is directly dependent on the magnitude of the magnetic field $\bar{B}$ for which the gradient is being measured.

$\bar{E}\cdot\dot{\bar{B}}$ is the eddy current contribution to the signal and is due to metallic objects located in relatively close proximity to the gradiometer. It should be noted that since this term of the signal is an induced contribution, it varies as the derivative of the magnetic field $\bar{B}$ and is zero when $\bar{B}$ is constant.

$\bar{a}$ is a five-component, cross-talk vector and represents the contribution from the other orthogonal components. $\bar{y}$ Is a five-component vector formed by the linearly dependent components of the gradient tensor G and is the signal component which is desired.

The present invention provides a method and a device which eliminates or reduces the components of the signal which are generated by the common mode and the eddy current factors.

The present invention produces a signal $\bar{P}$ as follows:

$$\bar{P} = \bar{C}\cdot\bar{B} + \bar{E}\cdot\dot{\bar{B}} \qquad (2)$$

This signal $\bar{P}$ is algebraically added to the signal $\bar{S}$ derived from the gradiometer so as to eliminate or reduce unwanted components. It has been found that the present invention improves the common mode rejection by a factor of 2.

SUMMARY OF THE INVENTION

One embodiment of the present invention includes a sensor for measuring the value of the magnetic field $\bar{B}$ to which the gradiometer is subjected. By placing the gradiometer in a uniform magnetic field, the values $\bar{C}$ and $\bar{E}$ can be determined for a given gradiometer and its close environment. Since gradiometers are superconducting devices, the entire support apparatus is placed in the uniform magnetic field so that the effects of this support apparatus on the values $\bar{C}$ and $\bar{E}$ are taken into consideration. A uniform magnetic field may be produced by any known method, as for example, a Helmholtz coil.

The apparatus also includes two function generators for producing signals as functions of $\bar{C}$ and $\bar{E}$.

The signal $\bar{B}$ is then fed to a mixer and is mixed with the signal $\bar{C}$ to produce a new signal $\bar{B}\cdot\bar{C}$, the value of the common mode component. The apparatus also includes a differentiator, as for example an operational amplifier, which forms a derivative $\dot{\bar{B}}$ of the magnetic field strength. This signal is mixed with the signal $\bar{E}$ to produce the eddy current component signal $\bar{E}\cdot\dot{\bar{B}}$. The common mode component and the eddy current component are then added together to form the compensating signal $\bar{C}\cdot\bar{B} + \bar{E}\cdot\dot{\bar{B}}$. This compensating signal is then subtracted from the gradiometer signal to produce a compensated gradiometer signal:

$$\bar{S} = \bar{C}\cdot\bar{B} + \bar{E}\cdot\dot{\bar{B}} + \bar{a}\cdot\bar{y} + K - (\bar{C}\cdot\bar{B} + \bar{E}\cdot\dot{\bar{B}}) = \bar{a}\cdot\bar{y} + K \qquad (3)$$

It can be seen that the new compensated gradiometer signal has a much improved resolution since two of the unwanted terms have been eliminated.

It is therefore an object of the present invention to provide an apparatus for eliminating or reducing unwanted common mode and/or eddy current terms in the output of a gradiometer signal.

In accordance with one aspect of the present invention there is provided a device for producing a compensated gradiometer signal from an uncompensated gradiometer signal having at least one unwanted term which varies as a function of magnetic field, comprising: sensing means for sensing said magnetic field; generating means for producing a first vector signal which is representative of the magnetic field; function generating means for producing a second vector signal which represents a component of one of said at least one unwanted term, mixing means connected to said generating means and said function generating means for producing a vector output signal equal to said one of said at least one unwanted term; and subtractor means connected to said mixing means for subtracting said vector output signal from said uncompensated gradiometer signal to thereby produce said compensated gradiometer signal.

In accordance with another aspect of the present invention there is provided a method of producing a compensated gradiometer signal from an uncompensated gradiometer signal having at least one unwanted term which varies as a function of magnetic field comprising the steps of: placing a gradiometer device in a uniform magnetic field of a first intensity; placing said gradiometer device in a uniform magnetic field of a second different intensity; determining the vector magnitude of one of said at least one unwanted term which varies directly as a function of magnetic field intensity; generating a vector signal equal to said vector magnitude of said one of said at least one unwanted term; and subtracting said vector signal from said uncompensated gradiometer signal to thereby produce said compensated gradiometer signal.

DESCRIPTION OF THE DRAWING

The present invention will be described in detail by way of example hereinbelow with the aid of the accompanying drawing which is a schematic diagram of the compensating device according to the present invention.

DETAILED DESCRIPTION

The FIGURE illustrates one embodiment of the device according to the present invention.

A gradiometer sensing element 10 is shown. It should be understood that for the sake of simplicity only one of the three spatially orthogonal components of the gradient of the magnetic field is sensed by element 10. Two other orthogonally oriented elements would be connected to electronic detector 12. The output of detector 12 is a vector quantity representative of the magnetic field gradient in free space. This vector quantity contains unwanted terms due to the presence of fixed objects which reduce the resolution of the overall system. In particular, there are two terms which vary as a function of the magnetic field strength and it is these terms which are reduced or eliminated by the device according to the present invention. One such term, known as the common mode term, varies directly with respect to the magnitude of the magnetic field. The other term, an inductive term, varies with respect to the rate of change of the magnitude of the magnitude field and is known as the eddy current term.

A magnetic field strength sensing element 14 is connected to an electronic detector 16. Once again, the FIGURE shows only one orthogonal element of the sensor. Two other sensors would be provided so that the output of the detector 16 is a vector quantity representative of the magnetic field $\overline{B}$.

The gradiometer is placed in a uniform magnetic field and the value of the common mode components is determined. A function generator 18 is then programmed to produce a vector signal equal to this component. The output of the detector 16 and the function generator 18 are fed to a mixer 20 which produces a dot product $\overline{C}\cdot\overline{B}$, which is the common mode term and one of the unwanted terms in the uncompensated gradiometer signal. This term could be directly subtracted from the uncompensated gradiometer signal to produce a gradiometer signal which is partially compensated with respect to this one term only, however, the partially compensated gradiometer signal can be further compensated as is shown in the FIGURE.

$\overline{B}$ of detector 16 is fed, in the FIGURE, to a differentiating circuit 22 of a known type, to produce a signal $\dot{\overline{B}}$ which is representative of the rate of change of the magnitude of the magnetic field with respect to time.

The gradiometer is placed in a uniform field which is varying. By knowing the rate of change of the magnetic field, the eddy current component $\overline{E}$ may be determined. Function generator 24 is then programmed to produce a vector signal representative of this eddy current component.

The outputs of differentiator 22 and function generator 24 are fed to mixer 26 which produces a dot product $\overline{E}\cdot\dot{\overline{B}}$ which is the eddy current compensating term. This term could be directly subtracted from the uncompensated gradiometer signal. However, according to the FIGURE, the output of mixers 20 and 26 are fed to adder 28 which produces the dual term compensating signal $\overline{C}\cdot\overline{B}+\overline{E}\cdot\dot{\overline{B}}$. This dual term signal is then fed to subtractor 30 which is also connected to detector 12 to produce the compensated gradiometer signal $\overline{a}\cdot\overline{y}+K$.

It should be understood that the present invention includes a device where only one term is compensated. However, in the embodiment shown in the FIGURE, the common mode term and the eddy current term are both simultaneously compensated.

The detectors for detecting the gradient of the magnetic field and the magnitude of the magnetic field can be of a known variety, for example, they can be squid detectors.

The embodiments of the invention in which an exclusive property or privilege is claimed are defined as follows:

1. A device for producing a compensated gradiometer signal from an uncompensated gradiometer signal having first and second unwanted terms respectively due to (1) imperfections in the construction of the gradiometer and fixed objects which induce magnetization, and (2) eddy currents due to metallic objects located in relatively close proximity to the gradiometer, said first term having a first component $\overline{B}$ which is a function of the field magnitude and a second component $\overline{C}$, and said second term having a first component $\dot{\overline{B}}$ which is a function of the derivative of the field and a second component $\overline{E}$, comprising:
    means for sensing the magnetic field and producing a magnitude signal indicating the magnitude thereof;
    first function generating means for producing a first function signal representing said second component $\overline{C}$ of said first term;
    means for mixing said magnitude signal and first function signal to produce a first term signal indicating said first term;
    means for differentiating said magnitude signal to produce a differentiated signal;
    second function generating means for producing a second function signal representing said second component $\overline{E}$ of said second term;
    means for mixing said differentiated signal and said second function signal to produce a second term signal indicating said second term;
    means for adding said first and second term signals to produce a compensating signal; and
    means for subtracting said compensating signal from said uncompensated signal to produce said compensated gradiometer signal.

2. A method of producing a compensated gradiometer signal from an uncompensated gradiometer signal having first and second unwanted terms respectively due to (1) imperfections in the construction of the gradiometer and fixed objects which induce magnetization, and (2) eddy currents due to metallic objects located in relatively close proximity to the gradiometer, said first term having a first component $\overline{B}$ which is a function of the field magnitude and a second component $\overline{C}$, and said second term having a first component $\dot{\overline{B}}$ which is a function of the derivative of the field and a second component $\overline{E}$, comprising the steps of:
    placing a gradiometer device in a uniform magnetic field of a first intensity;
    placing said gradiometer device in a uniform magnetic field of a second different intensity;
    determining the vector magnitude of said first component of said first term which varies directly as a function of magnetic field intensity;
    generating a first vector signal equal to said vector magnitude of said first component of said first term;
    varying a uniform magnetic field between two bounds to provide a known rate of change in said uniform magnetic field;
    determining the vector magnitude of said first component of said second term which varies directly as a function of the rate of change of the magnitude of the magnetic field intensity with respect to time;
    generating a second vector signal equal to said vector magnitude of one of said second term which varies directly as a function of the rate of change of magnetic field intensity;
    adding said first and second vector signals to produce a compensating signal; and
    subtracting said compensating signal from said uncompensated gradiometer signal to thereby produce said compensated gradiometer signal.

* * * * *